United States Patent
Choi

(10) Patent No.: US 7,217,337 B2
(45) Date of Patent: May 15, 2007

(54) PLASMA PROCESS CHAMBER AND SYSTEM

(76) Inventor: Dae-Kyu Choi, #361-2, Shin-dong, Paldal-gu, Suwon-si, Kyounggi-do (KR)

( * ) Notice: Subject to any disclaimer, the term of this patent is extended or adjusted under 35 U.S.C. 154(b) by 379 days.

(21) Appl. No.: 10/402,927

(22) Filed: Apr. 1, 2003

(65) Prior Publication Data

US 2004/0094270 A1    May 20, 2004

(30) Foreign Application Priority Data

Nov. 14, 2002    (KR)    .................... 10-2002-0070690

(51) Int. Cl.
C23F 1/00          (2006.01)
C23C 16/00        (2006.01)
H01L 21/306      (2006.01)

(52) U.S. Cl. .................... 156/345.38; 156/345.43; 156/345.46; 156/348.48; 156/345.49; 118/723 E; 118/723 I

(58) Field of Classification Search ............ 118/723 I, 118/723 IR, 719; 156/345.48, 345.49
See application file for complete search history.

(56) References Cited

U.S. PATENT DOCUMENTS

| | | | | |
|---|---|---|---|---|
| 4,615,756 | A | * | 10/1986 | Tsujii et al. ........... 156/345.35 |
| 4,811,684 | A | * | 3/1989 | Tashiro et al. ............ 118/50.1 |
| 5,032,205 | A | * | 7/1991 | Hershkowitz et al. . 156/345.46 |
| 5,435,881 | A | * | 7/1995 | Ogle ..................... 156/345.42 |
| 5,487,785 | A | * | 1/1996 | Horiike et al. .......... 118/723 E |
| 5,571,366 | A | * | 11/1996 | Ishii et al. ............. 156/345.26 |
| 5,683,548 | A | * | 11/1997 | Hartig et al. ............... 438/729 |
| 5,900,064 | A | | 5/1999 | Kholodenko |
| 5,944,902 | A | * | 8/1999 | Redeker et al. ....... 118/723 AN |
| 5,976,308 | A | * | 11/1999 | Fairbairn et al. ...... 156/345.33 |
| 6,095,084 | A | | 8/2000 | Shamouilian et al. |
| 6,302,057 | B1 | * | 10/2001 | Leusink et al. .......... 118/723 E |
| 6,348,126 | B1 | * | 2/2002 | Hanawa et al. ........ 156/345.49 |
| 6,380,684 | B1 | * | 4/2002 | Li et al. ................. 315/111.21 |
| 6,387,208 | B2 | * | 5/2002 | Satoyoshi et al. ...... 156/345.37 |
| 6,392,351 | B1 | * | 5/2002 | Shun'ko ................. 315/111.51 |
| 6,418,874 | B1 | * | 7/2002 | Cox et al. ................. 118/723 I |
| 6,432,260 | B1 | * | 8/2002 | Mahoney et al. ...... 156/345.35 |

(Continued)

Primary Examiner—Karla Moore
(74) Attorney, Agent, or Firm—Robert E. Bushnell, Esq.

(57) ABSTRACT

The present invention relates to a plasma process chamber, which includes: an upper housing having a gas inlet connected to a gas source, and a gas shower head placed in the upper housing; and a lower housing having a gas outlet connected to a vacuum pump, and a substrate provided on the inner bottom of the lower housing. On the substrate is placed a wafer. A plasma reactor is provided between the upper housing and the lower housing of the plasma process chamber. The plasma reactor is provided on the outer circumference of its main body with at least one reactor tube of horseshoe shape. A closed magnetic core is attached to the reactor tube, and a coil is wound on said magnetic core. The coil is connected electrically to an A.C. power. The plasma reactor is placed in the middle area of the plasma process chamber and a plurality of the reactor tubes are provided on the outer circumference of the plasma reactor so that plasma reaction is generated and distributed evenly in the plasma process chamber. Consequently, high density of the plasma can be obtained. Furthermore, the generated plasma ion particles are diffused evenly in the plasma process chamber by the diffusion induction electrodes so that cleaning efficiency can be highly increased in the plasma process chamber.

1 Claim, 15 Drawing Sheets

U.S. PATENT DOCUMENTS

| | | |
|---|---|---|
| 6,490,994 B1 | 12/2002 | Yoshizawa |
| 6,508,199 B1 | 1/2003 | Oyabu |
| 6,537,421 B2 * | 3/2003 | Drewery ................ 156/345.48 |
| 6,679,981 B1 * | 1/2004 | Pan et al. ............... 204/298.06 |
| 6,755,150 B2 * | 6/2004 | Lai et al. .................. 118/723 I |
| 6,835,278 B2 * | 12/2004 | Selbrede et al. ....... 156/345.35 |
| 2001/0015175 A1 | 8/2001 | Masuda et al. |
| 2001/0018951 A1 | 9/2001 | Masuda et al. |
| 2002/0066536 A1 | 6/2002 | Hongoh et al. |

\* cited by examiner

PLASMA PROCESS CHAMBER AND SYSTEM

CLAIM OF PRIORITY

This application makes reference to, incorporates the same herein, and claims all benefits accruing under 35 U.S.C. §119 from an application for "PLASMA PROCESS CHAMBER AND SYSTEM" earlier filed in the Korean Patent Office on Nov. 14, 2002, and there duly assigned Ser. No. 2002-70690 by that office.

BACKGROUND OF THE INVENTION

1. Field of the Invention

The present invention relates generally to a plasma process chamber and system, and more particularly to a plasma process chamber and system of the structure that is capable of improving uniformity of plasma and generation density of plasma in the plasma process chamber when carrying out a process using plasma.

2. Description of Related Art

A plasma source is used widely in several processes for manufacturing semiconductor devices, for example such as etching, stripping, cleaning, etc. A plasma process chamber is used to manufacture the semiconductor devices while the processes, such as etching, stripping, etc. are carried out using plasma gas in a process for manufacturing semiconductor devices.

In a plasma related application, how to realize stable generation of plasma and to provide high ionization efficiency for the plasma have become continuous problems to be solved by technical experts of this art. Moreover, several technical studies for increasing uniformity of the plasma have been developed continually. In a process using the plasma, plasma gas must be distributed evenly in the plasma process chamber so that the corresponding process goes on effectively.

In recent years, the size of wafers has been increased in order to improve a production rate of the semiconductors. In addition, several technical problems to be solved have been brought about in the process of manufacturing the semiconductors. One of the aforesaid problems is that a plasma process chamber capable of obtaining uniform plasma is required. Furthermore, plasma ion particles must be diffused evenly in the plasma process chamber so that the plasma process chamber can be cleaned more effectively.

SUMMARY OF THE INVENTION

The present invention is proposed in order to overcome the aforesaid and other drawbacks of the earlier art.

Accordingly, it is an object of the present invention to provide a plasma process chamber capable of obtaining high uniformity and density of the plasma.

It is another object of the present invention to provide a plasma process chamber in which plasma ion particles can be diffused evenly.

It is still another object of the present invention to provide a plasma process chamber that increases the cleaning efficiency and is easy and inexpensive to manufacture and simple to use and yet be efficient in obtaining plasma.

According to one aspect of the present invention to accomplish the objects of the invention as mentioned above, the plasma process chamber includes: an upper housing having a gas inlet connected to a gas source, and a gas shower head placed in the upper housing; a lower housing having a gas outlet connected to a vacuum pump, and a substrate provided on the inner bottom of the lower housing, on which a wafer is placed; and a plasma reactor provided between the upper housing and the lower housing, wherein the plasma reactor includes a main body, at least one reactor tube of horseshoe shape, the reactor tube being attached on the outer circumference of the main body, a closed magnetic core attached to the reactor tube, and a coil wound on the magnetic core, the coil being connected electrically to an A.C. (alternating current) power source via an impedance matching unit.

In a preferred embodiment of the present invention, the reactor tube is made of a metal, and an insulator is provided between the main body and the reactor tube.

In a preferred embodiment of the present invention, O-rings are provided between the upper housing and the plasma reactor and between the lower housing and the plasma reactor, respectively.

In a preferred embodiment of the present invention, the main body of the plasma reactor is attached integrally to the upper housing and/or to the lower housing.

In a preferred embodiment of the present invention, the plasma reactor is provided at the inner side of the main body with a shutter for closing or opening an opening of the reactor tube.

In a preferred embodiment of the present invention, each of the coils wound on at least one the magnetic core is connected electrically to the A.C. power source, and each of the coils is connected electrically either in series or in parallel with the A.C. power source.

In a preferred embodiment of the present invention, each of the coils wound on at least one the magnetic core is connected electrically to each of independent A.C. power sources.

In a preferred embodiment of the present invention, an ignition plug is provided at one side of the reactor tube.

According to another aspect of the present invention, the plasma process chamber includes: an upper housing having a first gas inlet connected to a first gas source, and a gas shower head placed in the upper housing; a lower housing having a gas outlet connected to a vacuum pump, and a substrate provided on the inner bottom of the lower housing, on which a wafer is placed; and a plasma reactor provided between the upper housing and the lower housing, wherein the plasma reactor includes a main body, at least one reactor tube of horseshoe shape, the reactor tube being attached on the outer circumference of the main body and having a second gas inlet connected to a second gas source, a closed magnetic core attached to the reactor tube, and a coil wound on the magnetic core, the coil being connected electrically to a first A.C. power source via a first impedance matching unit.

In a preferred embodiment of the present invention, the plasma process chamber further includes diffusion induction means for diffusing plasma gas generated by the plasma reactor.

In a preferred embodiment of the present invention, the diffusion induction means uses the gas shower head placed in the upper housing as a first electrode, the diffusion induction means uses the substrate placed in the lower housing as a second electrode, and the first and second electrodes are connected electrically to a second A.C. power source via a second impedance matching unit.

In a preferred embodiment of the present invention, the plasma process chamber further includes a first insulator for insulating the gas shower head and the upper housing, and a second insulator for insulating the substrate and the lower housing.

In a preferred embodiment of the present invention, the upper housing or the lower housing is used as a grounding electrode.

In a preferred embodiment of the present invention, the diffusion induction means includes a diffusion induction coil arranged on the upper part of the gas shower head provided in the upper housing and connected electrically to the second A.C. power source via the second impedance matching unit.

In a preferred embodiment of the present invention, the diffusion induction means includes at least one magnetic core arranged on the outer upper part of the upper housing, and a coil wound on the magnetic core and connected electrically to the second A.C. power source via the second impedance matching unit.

According to still another aspect of the present invention, the plasma process system includes: a first gas source for supplying a first gas; a second gas source for supplying a second gas; a plasma process chamber including an upper housing having a gas shower head connected to a first gas inlet for receiving a first gas, and a lower housing having a gas outlet and a substrate, on which a wafer is placed; a plasma reactor including a main body provided between the upper housing and the lower housing, at least one reactor tube of horseshoe shape, the reactor tube being attached on the outer circumference of the main body and having a second gas inlet connected to the second gas source, a closed magnetic core attached to the reactor tube, and a coil wound on the magnetic core; a first A.C. power source for supplying A.C. power to the coil wound on the magnetic core; and a first impedance matching unit connected between the coil wound on the magnetic core and the first A.C. power source.

In a preferred embodiment of the present invention, the plasma process system further includes: diffusion induction means for diffusing plasma ion particles generated in the plasma process chamber by the plasma reactor; a second A.C. power source for supplying A.C. power to the diffusion induction means; and a second impedance matching unit connected between the diffusion induction means and the second A.C. power source.

In a preferred embodiment of the present invention, the diffusion induction means uses the gas shower head placed in the upper housing as a first electrode, the diffusion induction means uses the substrate placed in the lower housing as a second electrode, and the first and second electrodes are connected electrically to a second A.C. power source via a second impedance matching unit.

In a preferred embodiment of the present invention, the plasma process system further includes a first insulator for insulating the gas shower head and the upper housing, and a second insulator for insulating the substrate and the lower housing.

In a preferred embodiment of the present invention, the upper housing or the lower housing is used as a grounding electrode.

In a preferred embodiment of the present invention, the diffusion induction means includes a diffusion induction coil arranged on the upper part of the gas shower head provided in the upper housing and connected electrically to the second A.C. power source via the second impedance matching unit.

In a preferred embodiment of the present invention, the diffusion induction means includes at least one magnetic core arranged on the outer upper part of the upper housing, and a coil wound on the magnetic core and connected electrically to the second A.C. power source via the second impedance matching unit.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1:
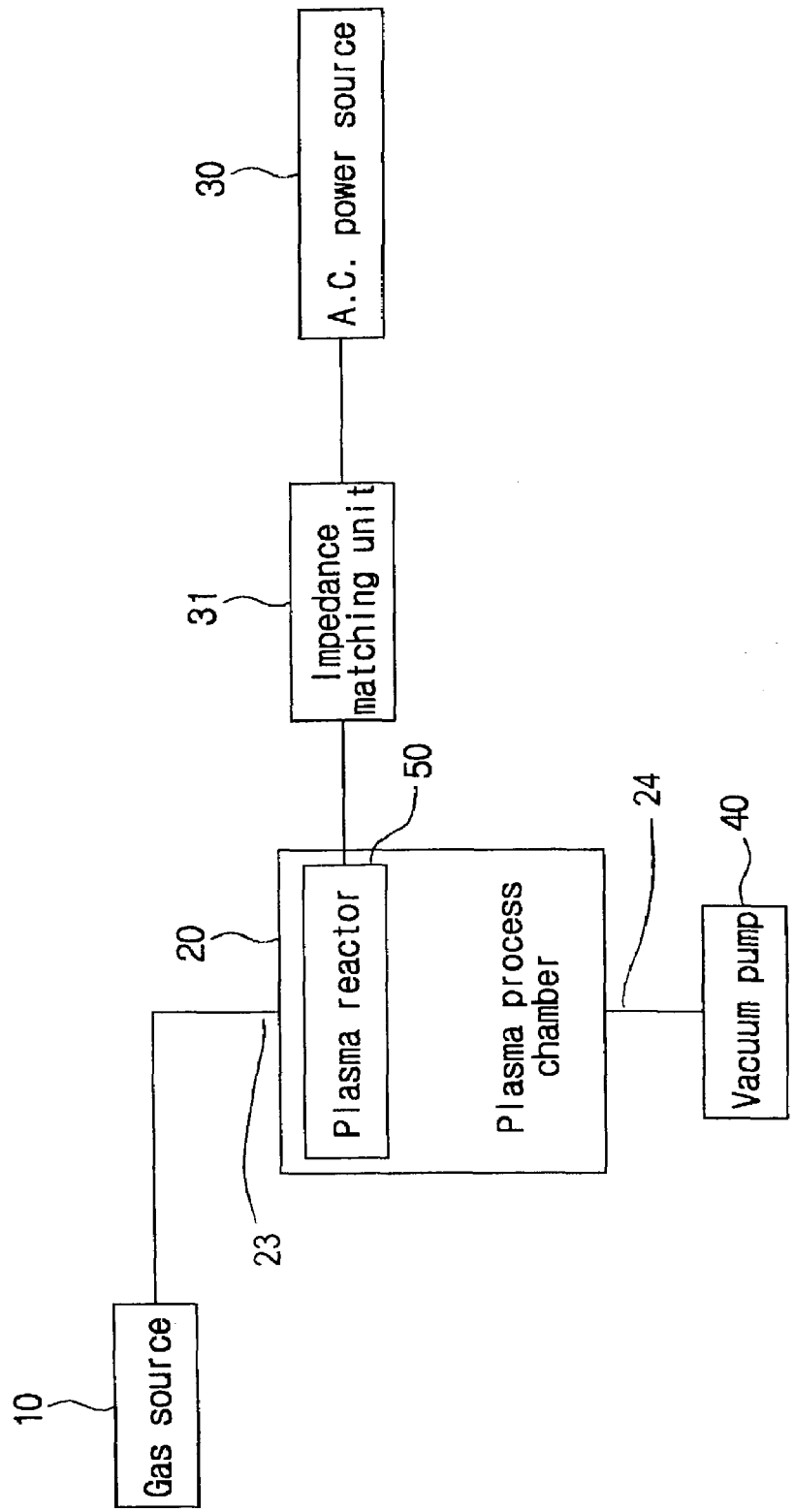
FIG. 1 is a schematic block diagram of a plasma process system according to a first preferred embodiment of the present invention.

The preferred embodiments of the present invention will now be described in detail below with reference to the accompanying drawings. It will be seen that similar reference numerals designate components with similar or corresponding functions throughout the drawings. In each of the drawings, parts other than main elements essential for describing the present invention are shown roughly or not shown at all. Furthermore, illustration of components applicable basically by those skilled in the art, and thus parts related to the present invention are shown principally. Especially, it should be noted that ratio of dimension of the components is a little bit different and some of the parts connected to one another are illustrated in such a manner that they are different from one another throughout the drawings, which is expected to be understood easily by those skilled in the art. Consequently, no detailed description of such difference will be given. Besides, like elements in each of the preferred embodiments of the present invention are given like reference numerals, and any repeated descriptions of such elements will be avoided.

Embodiment 1

FIG. 1 is a schematic block diagram of a plasma process system according to a first preferred embodiment of the present invention.

Referring to the drawings, the plasma process system according to a first preferred embodiment of the present invention generally includes a gas source 10, a plasma process chamber 20, an A.C. (alternating current) power source 30, an impedance matching unit 31, a vacuum pump 40, and a plasma reactor 50.

The plasma reactor 50 may be placed in the plasma process chamber 20 integrally or separately, although the plasma reactor is placed in the plasma process chamber 20 separately in this embodiment. The vacuum pump 40 is provided to keep uniform vacuum in the plasma process chamber 20 and to discharge gas after the process has been carried out.

Process gas is supplied from the gas source 10 to the plasma process chamber 20, and an actuating power is supplied from the A.C. power source 30 to the plasma reactor 50 so that plasma reaction is generated in the plasma process chamber 20. Uniform vacuum is kept in the plasma process chamber 20 by means of the vacuum pump 40. As the process goes on, the plasma gas in the plasma process chamber 20 is discharged to the outside.

Figure 2:
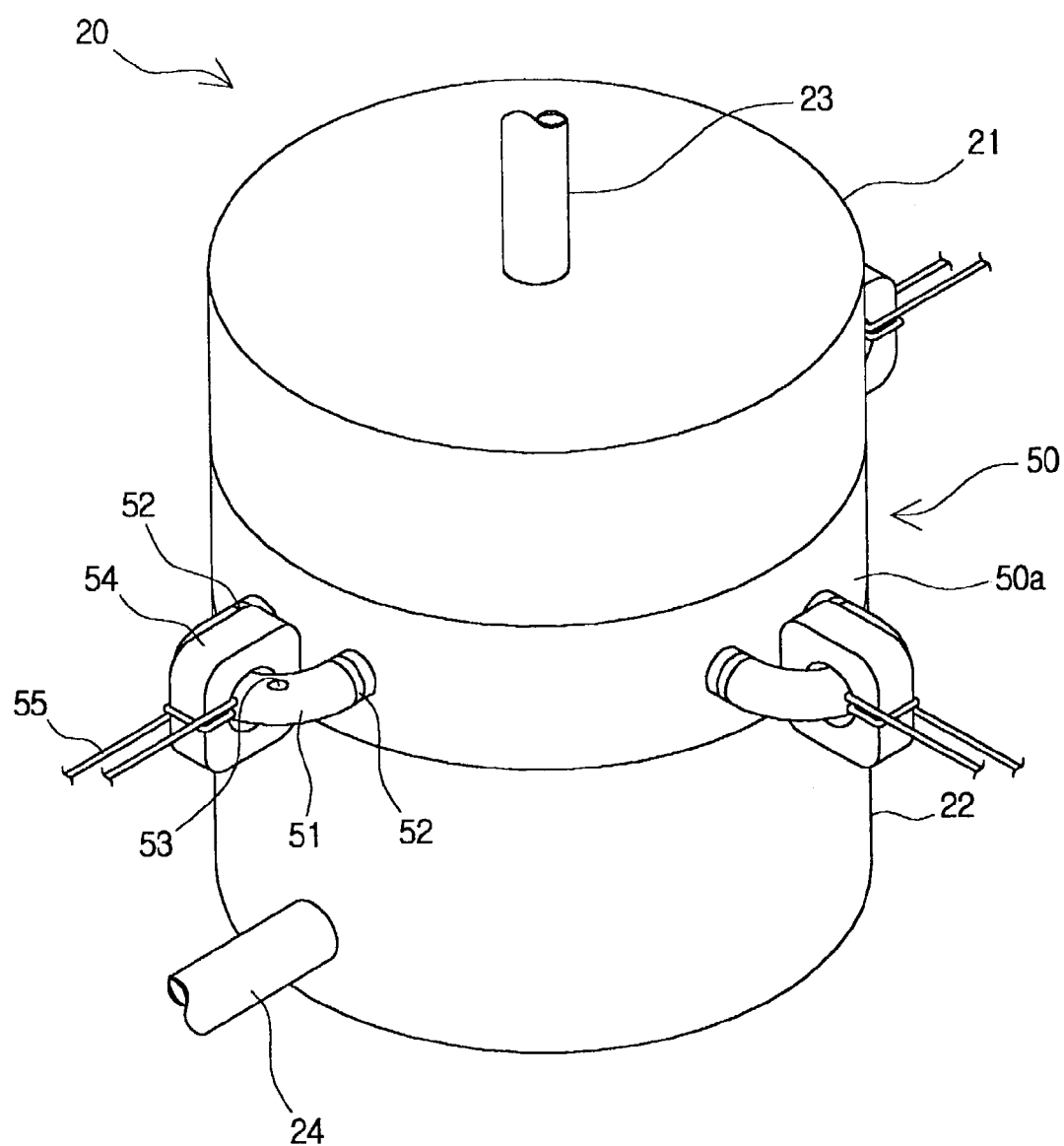
FIG. 2 is a perspective view of a plasma process chamber shown in FIG. 1.
Figure 3:
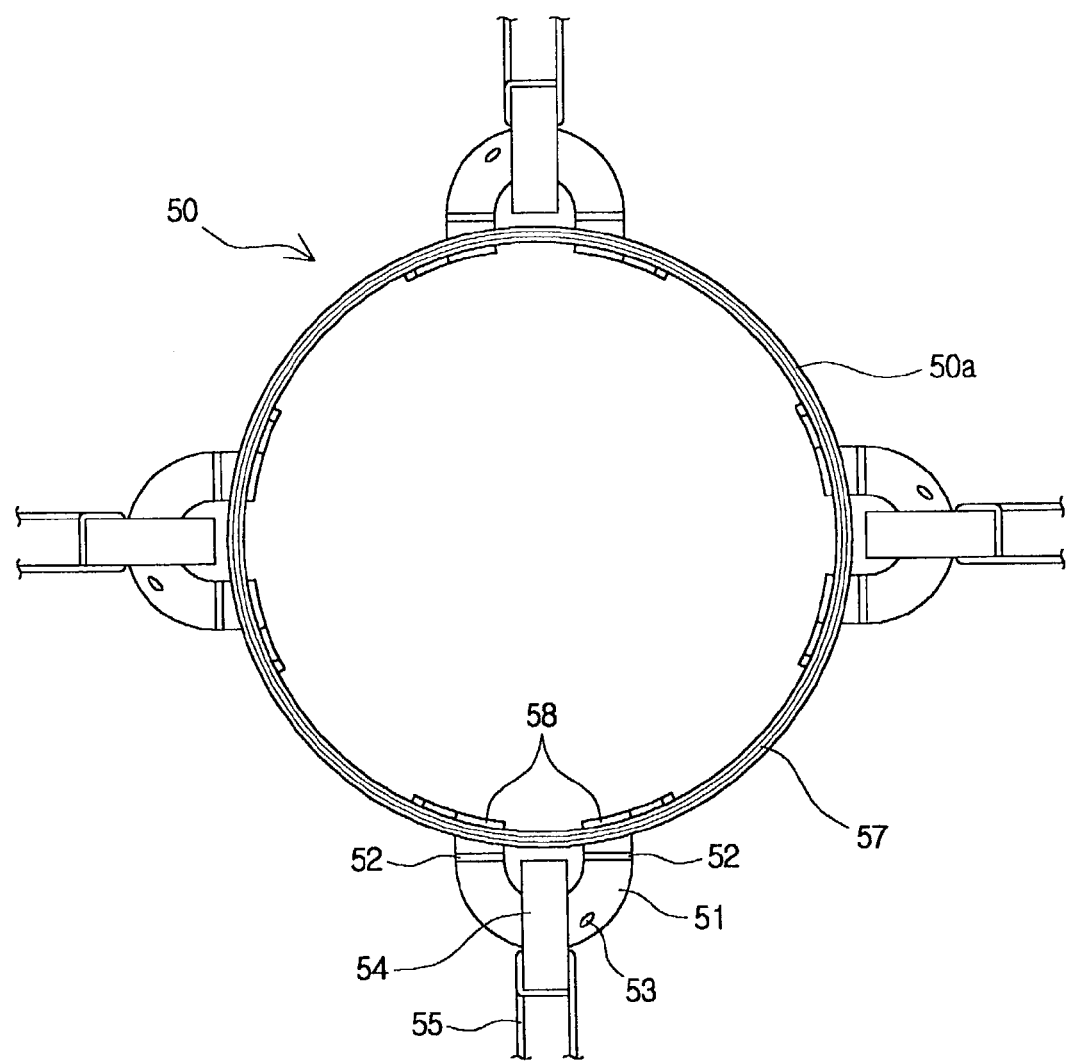
FIG. 3 is a plan view of a plasma reactor shown in FIG. 2.
Figure 4:
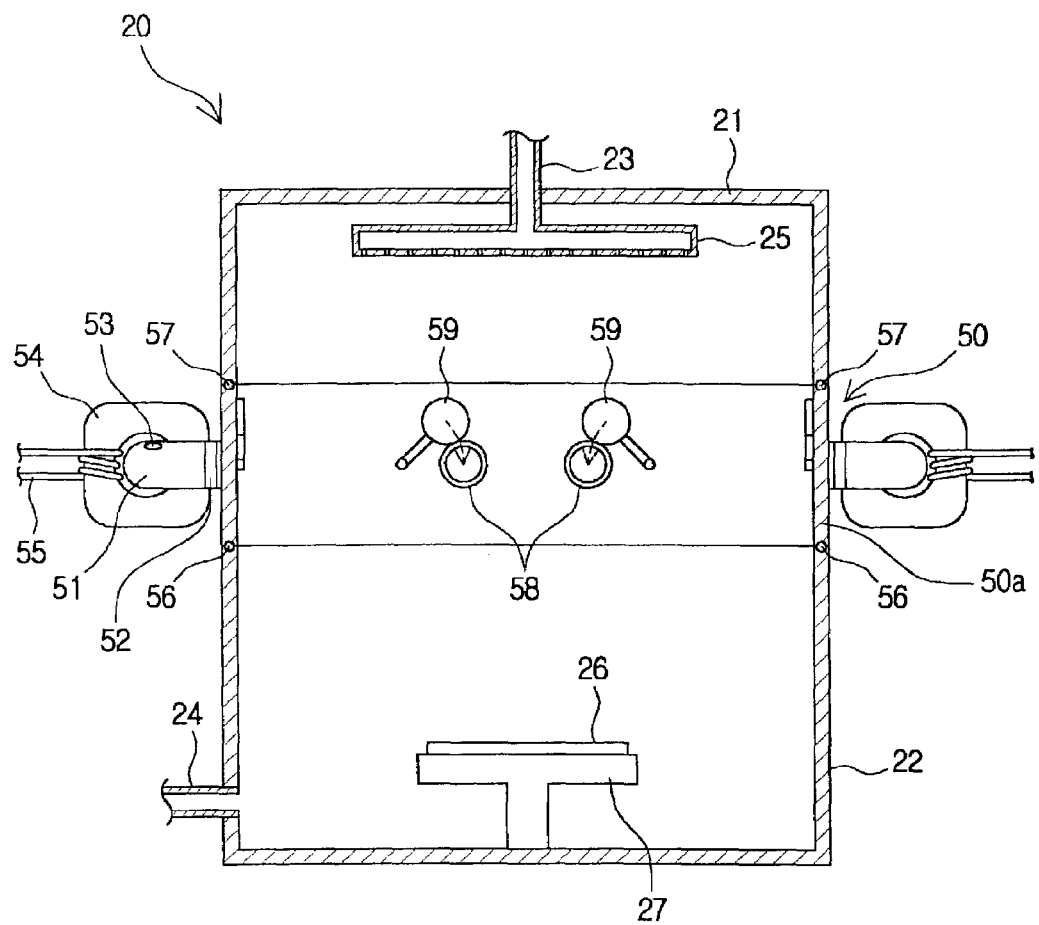
FIG. 4 is a cross sectional view of the plasma process chamber shown in FIG. 2.

Now, the structure of the plasma process chamber 20 will be described in more detail with reference to FIG. 2, FIG. 3, and FIG. 4 of the accompanying drawings. FIG. 2 is a perspective view of a plasma process chamber shown in FIG. 1, FIG. 3 is a plan view of a plasma reactor shown in FIG. 2, and FIG. 4 is a cross sectional view of the plasma process chamber shown in FIG. 2.

Referring to the drawings, the plasma process chamber 20, in which the plasma reactor 50 is placed, may be formed of a cylindrical shape as a whole. The plasma process chamber generally includes an upper housing 21 and a lower housing 22. Between the upper housing 21 and the lower housing 22 is placed the plasma reactor 50. For the purpose of keeping airtight, between the upper housing 21 and the plasma reactor 50 is provided an O-ring 56, and between the lower housing 22 and the plasma reactor 50 is provided another O-ring 57. In this embodiment, the plasma reactor 50 is placed in the plasma process chamber 20 separately. However, It should be noted that the plasma reactor 50 may be attached integrally either to the upper housing 21 or to the lower housing 22. Otherwise, the plasma reactor 50 may also be attached integrally to both of the upper housing 21 and the lower housing 22.

The upper housing 21 is provided at the center thereof with a gas inlet 23, which is connected to the gas source 10. At the end of the gas inlet 23 inserted into the inner part of the upper housing 21 is mounted a gas shower head 25. The lower housing 22 is provided at the lower end thereof with a gas outlet 24, which is connected to the vacuum pump 40. At the center of the bottom of the lower housing 22 is provided a substrate 27, on which a wafer is placed. Even though not shown definitely in the drawings, a door (not shown) for the plasma process chamber 20 may be attached to the upper housing 21.

The plasma reactor 50 includes a main body 50a of cylindrical ring shape, and at least one reactor tube 51 of horseshoe shape (or U-shape), which is attached at regular intervals on the outer circumference of the main body 50a. The reactor tube 51 is made of a metal, and between the main body 50a and the reactor tube 51 is provided an insulator 52. Closed magnetic cores are attached to a plurality of the reactor tubes 51, respectively. On each of the magnetic core 54 is wound a coil 55 connected electrically to the A.C. power source 30 via the impedance matching unit 31. Each of the coils 55 is connected electrically either in series or in parallel with the A.C. power source 30. Alternatively, each of the coils 55 may be connected electrically to additional A.C. power sources, respectively. At one side of the reactor tube 51 is provided an ignition plug 53, which is connected electrically to an ignition source (not shown).

The plasma reactor 50 is provided at the inner side thereof with a shutter 59 for closing or opening an opening 58 of the reactor tube 51. The shutter 59 closes the opening 58 of the reactor tube 51 as long as the plasma reactor 50 is not operated, while the shutter 59 opens the opening 58 of the reactor tube 51 as long as the plasma reactor 50 is operated.

At this time, the shutter 59 opens the opening 58 of the reactor tube 51, and the A.C. power supplied from the A.C. power source 30 is applied to each of the coils 55 via the impedance matching unit 31. As a result, magnetic induction is created at the magnetic cores 54, and secondary electric field forming a closed loop up to the inside of the process chamber 20 is generated in accordance with the shape of the reactor tube 51. And then, plasma reaction is generated when the ignition source (not shown) is applied to the ignition plug 53.

The plasma reactor 50 is provided in the middle area of the plasma process chamber 20, 3 and a plurality of the reactor tube 51 are provided along the outer circumference of the plasma 4 reactor 50. Consequently, the plasma reaction is generated evenly in the plasma process chamber 20 so that uniform plasma with high density is obtained.

Embodiment 2

Figure 5:
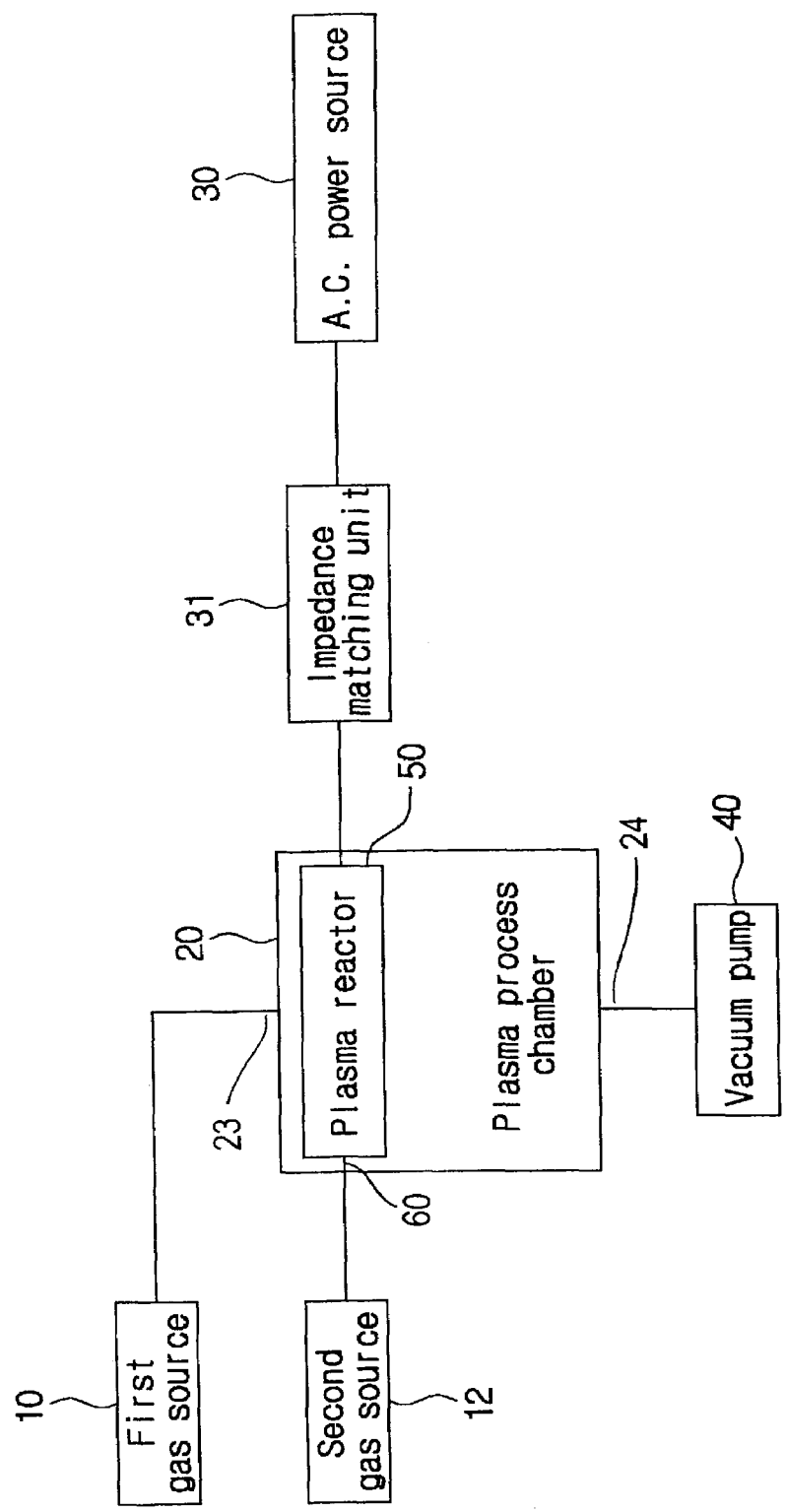
FIG. 5 is a schematic block diagram of a plasma process system according to a second preferred embodiment of the present invention.
Figure 6:
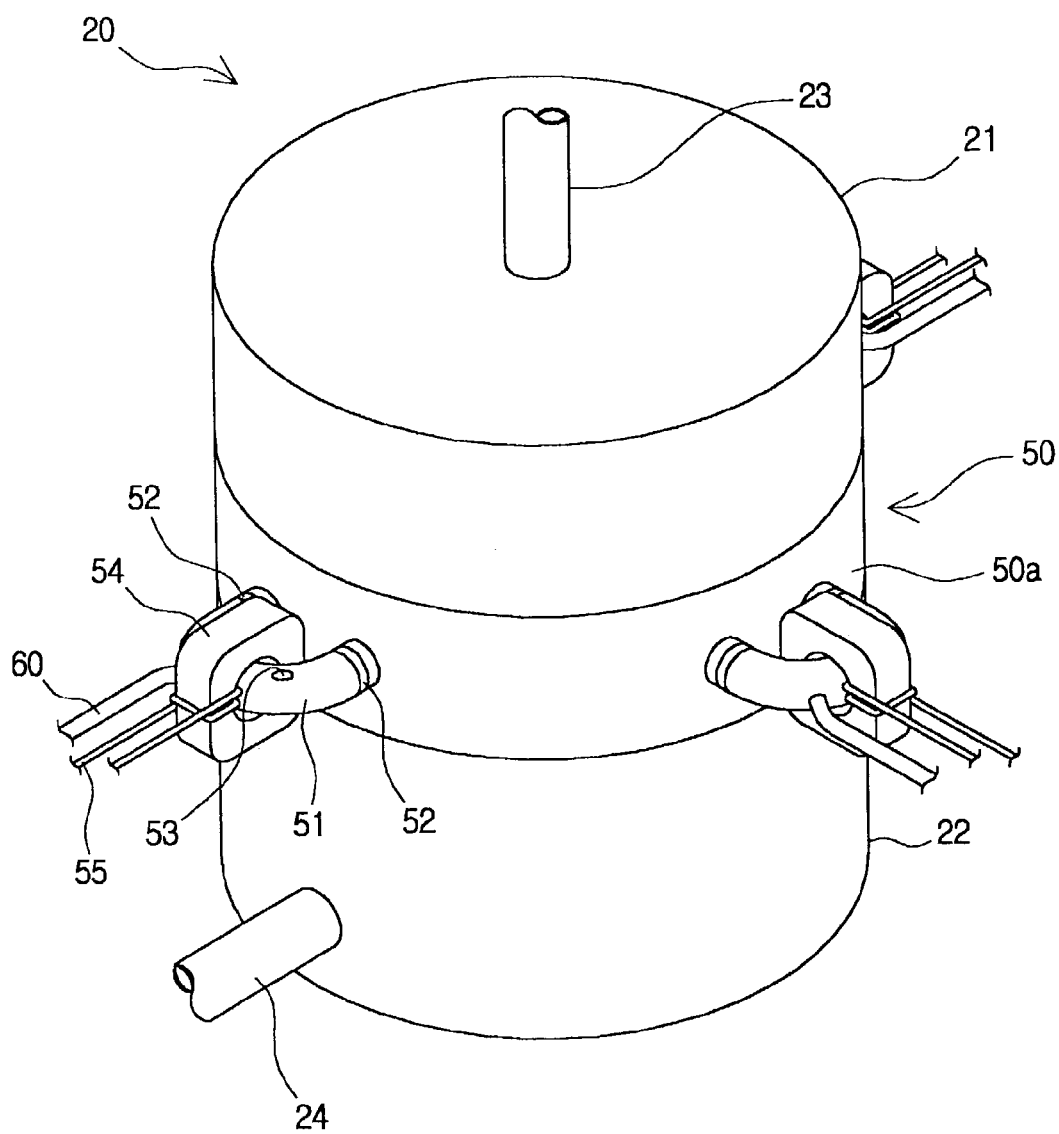
FIG. 6 is a perspective view of a plasma process chamber shown in FIG. 5.
Figure 7:
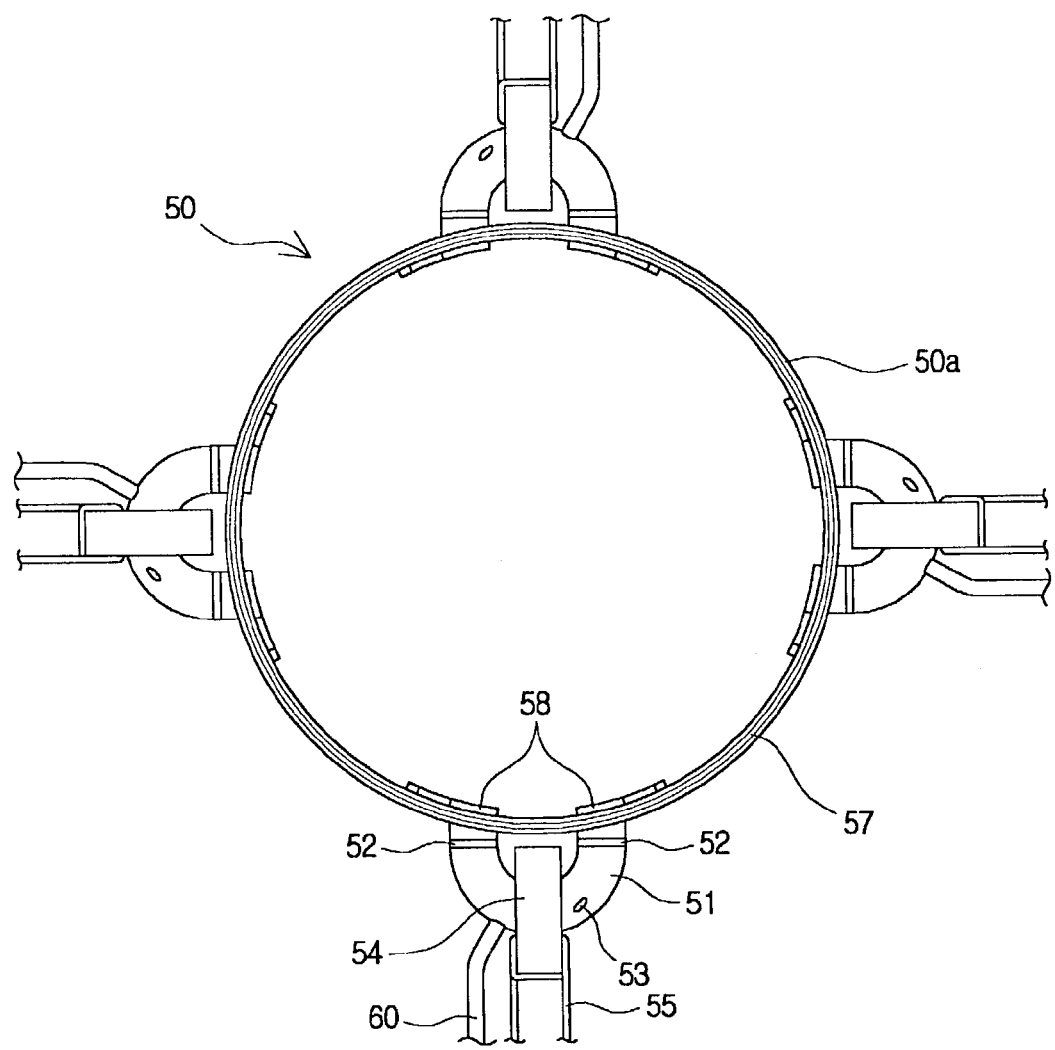
FIG. 7 is a plan view of a plasma reactor shown in FIG. 6.
Figure 8:
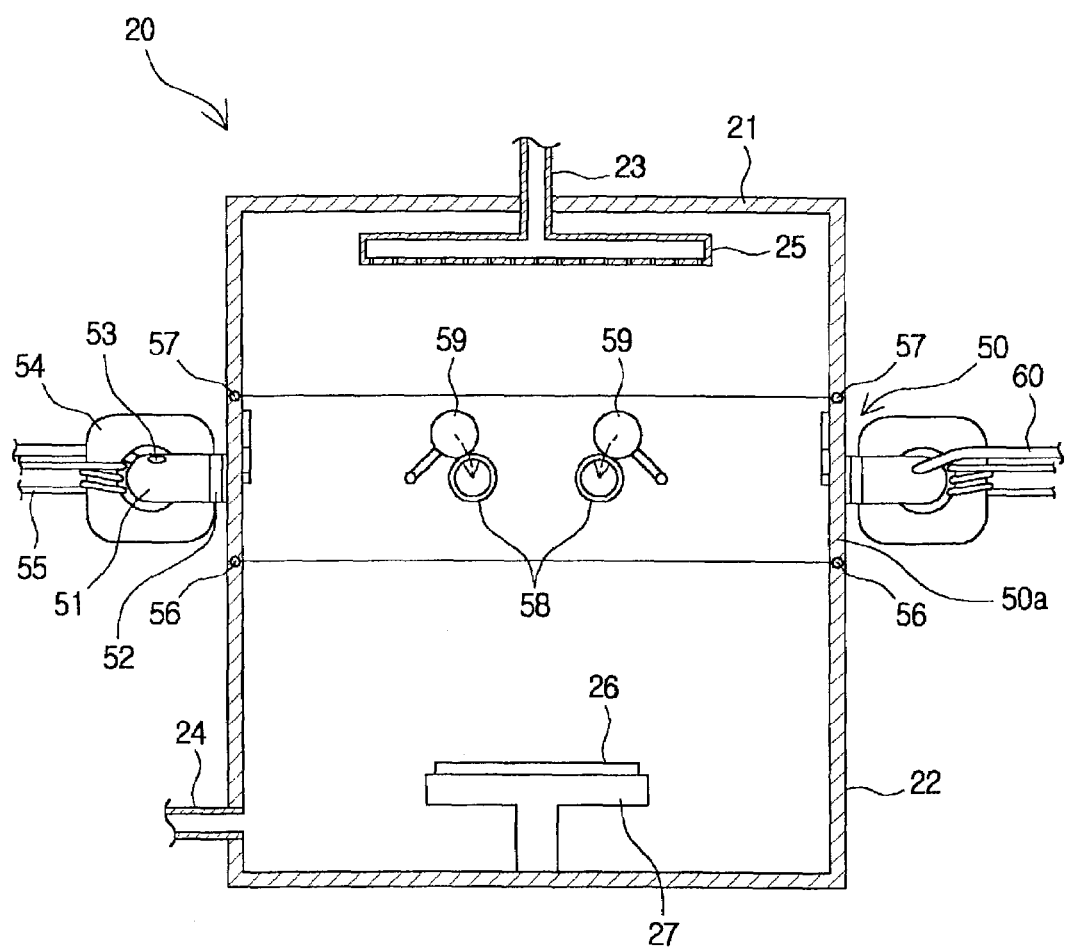
FIG. 8 is a cross sectional view of the plasma process chamber shown in FIG. 6.

FIG. 5 is a schematic block diagram of a plasma process system according to a second preferred embodiment of the present invention, FIG. 6 is a perspective view of a plasma process chamber shown in FIG. 5, FIG. 7 is a plan view of a plasma reactor shown in FIG. 6, and FIG. 8 is a cross sectional view of the plasma process chamber shown in FIG. 6.

Referring to the drawings, the plasma process system according to a second preferred embodiment of the present invention generally includes a first gas source 10, a second gas source 12, a plasma process chamber 20, an A.C. power source 30, an impedance matching unit 31, a 14 vacuum pump 40, and a plasma reactor 50.

The first gas source 10 is provided to store process gas, which is used to carry out a wafer manufacturing process, while the second gas source 12 is provided to store cleaning gas, which is used to clean the plasma process chamber 20. In this embodiment, the process gas flows directly in the plasma process chamber 20, and the cleaning gas flows in the plasma process chamber 20 via the plasma reactor 50. It is also possible, of course, to modify its construction in such a manner that the cleaning gas flows in the plasma process chamber 20 along the inflow path of the process gas.

In a process for cleaning the plasma process chamber 20, the cleaning gas is supplied from the second gas source 12. At this time, the shutter 59 opens the opening 58 of the reactor tube 51, and the A.C. power supplied from the A.C. power source 30 is applied to each of the coils 55 via the impedance matching unit 31. As a result, magnetic induction is created at the magnetic cores 54, and secondary electric field forming a closed loop up to the inside of the process chamber 20 is generated in accordance with the shape of the reactor tube 51. And then, plasma reaction is generated when the ignition source (not shown) is applied to the ignition plug 53.

The plasma reactor 50 is provided in the middle area of the plasma process chamber 20, and a plurality of the reactor tube 51 are provided along the outer circumference of the plasma reactor 50. Each of the reactor tube 51 is provided with a gas inlet 60 connected to a second gas source 12. In a process for cleaning the plasma process chamber 20, cleaning gas is supplied from the second gas source 12. Consequently, the plasma reaction is generated evenly in the plasma process chamber 20 so that uniform plasma with high density is obtained.

Embodiment 3

Figure 9:
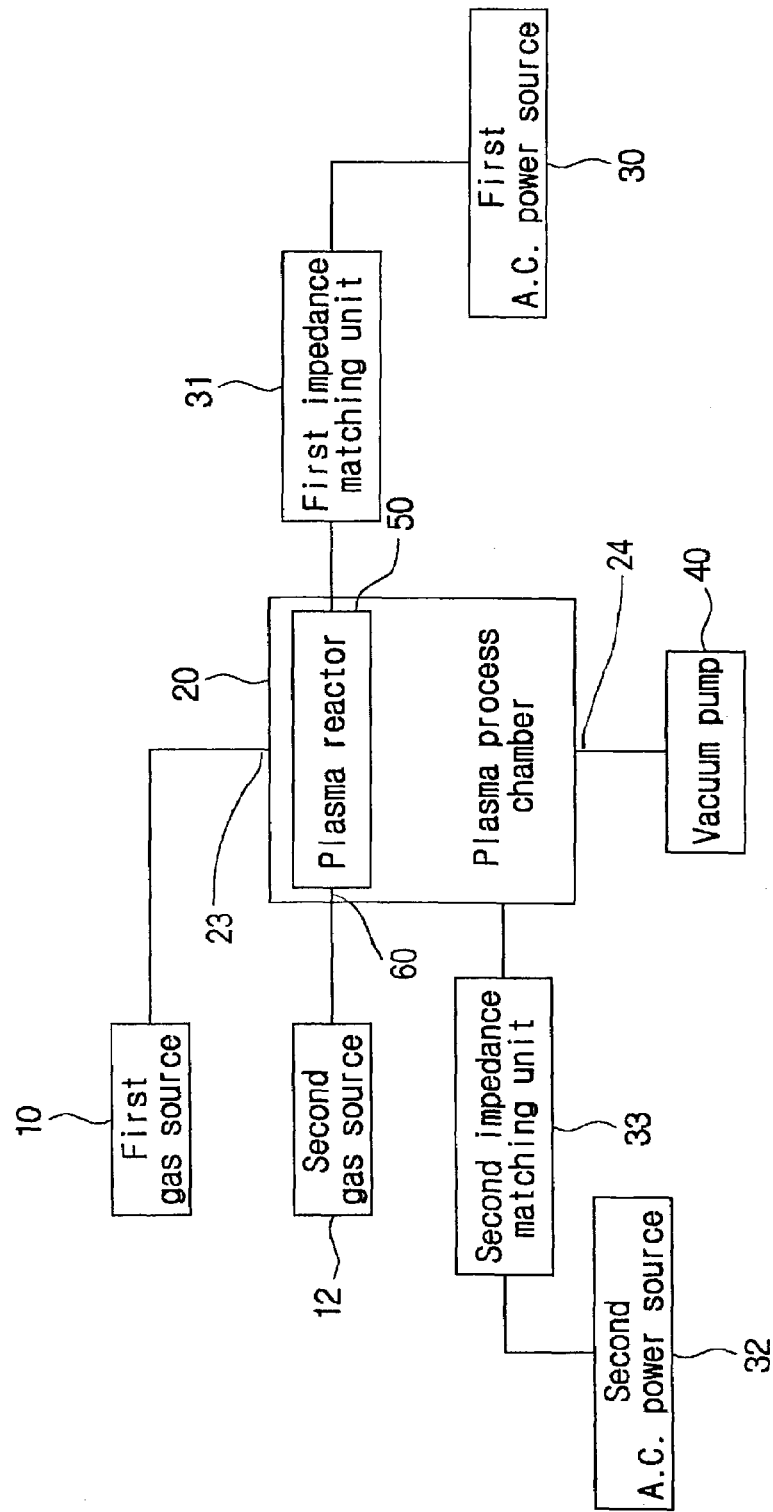
FIG. 9 is a schematic block diagram of a plasma process system according to a third preferred embodiment of the present invention.

FIG. 9 is a schematic block diagram of a plasma process system according to a third preferred embodiment of the present invention.

Referring to the drawings, the plasma process system according to a third preferred embodiment of the present invention generally includes a first gas source 10, a second gas source 12, a plasma process chamber 20, a first A.C. power source 30, a second A.C. power source 32, a first impedance matching unit 31, a second impedance matching unit 33, a vacuum pump 40, and a plasma reactor 50.

The first A.C. power source 30 is connected to the plasma reactor 50 via the first impedance matching unit 31 for supplying ionization energy for plasma reaction, while the second A.C. power source 32 is provided to supply diffusion energy to the plasma gas in the plasma process chamber 20 via the second impedance matching unit 33. Here, the diffusion energy means the energy for diffusing the plasma gas evenly in the plasma process chamber 20.

Figure 10:
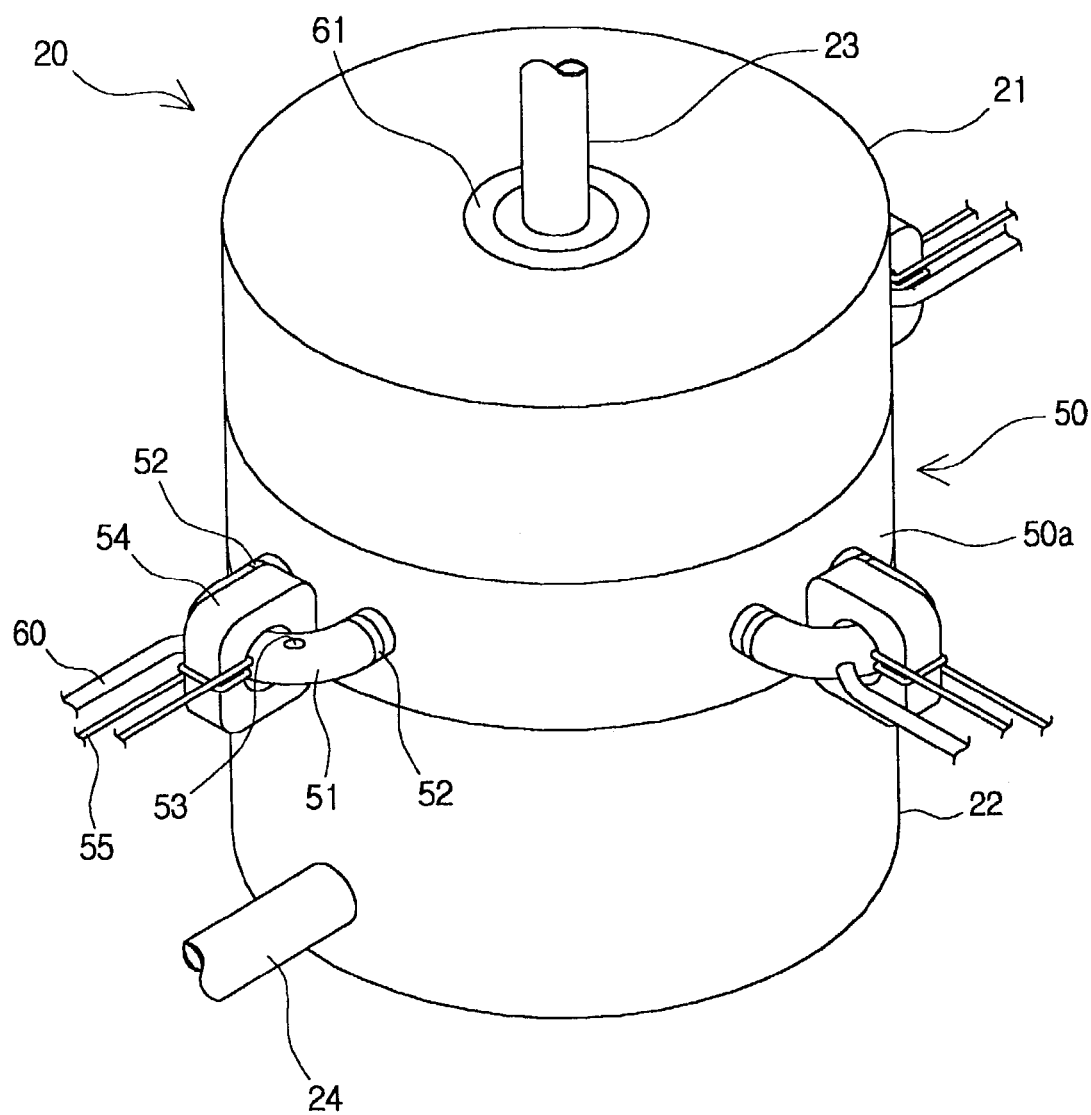
FIG. 10 is a perspective view of a plasma process chamber shown in FIG. 9.
Figure 11:
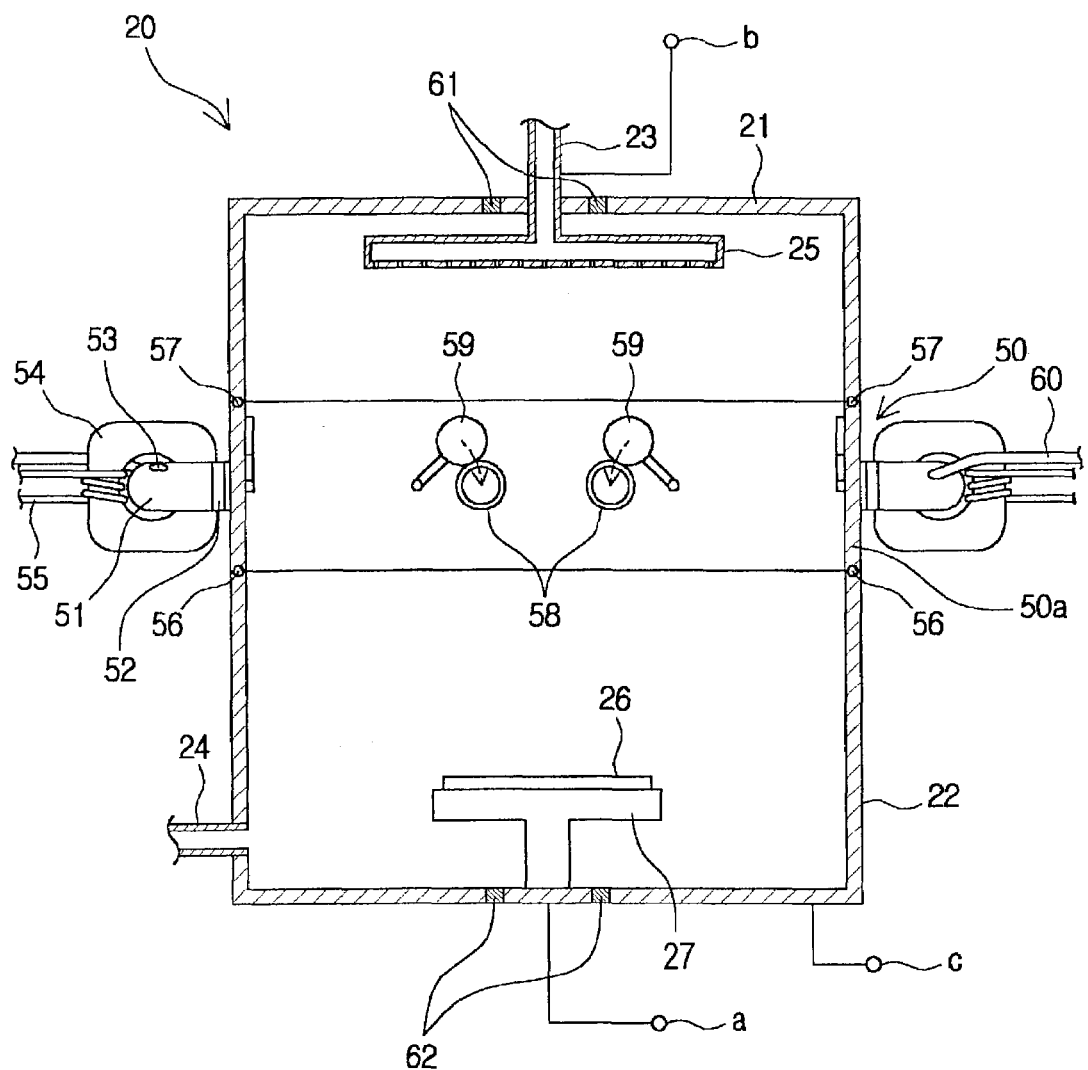
FIG. 11 is a cross sectional view of the plasma process chamber shown in FIG. 10.
Figure 12A:
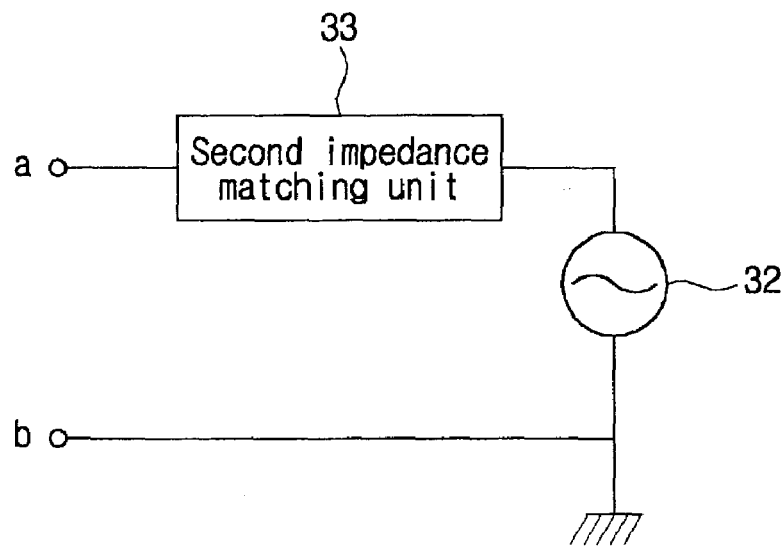
FIG. 12a and FIG. 12b are circuit diagrams each showing electrical connection of diffusion induction electrodes of the plasma process chamber shown in FIG. 11.
Figure 12B:
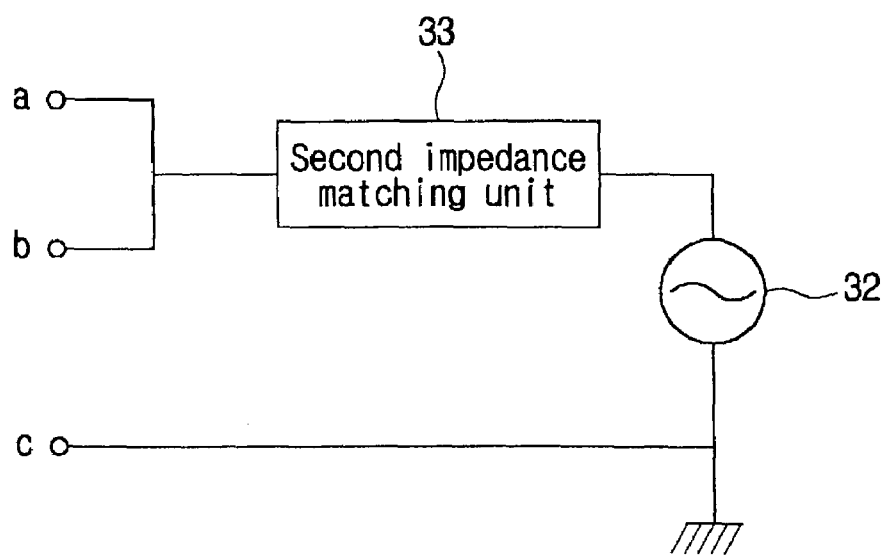

FIG. 10 is a perspective view of a plasma process chamber shown in FIG. 9, FIG. 11 is a cross sectional view of the plasma process chamber shown in FIG. 10, and FIG. 12a and FIG. 12b are circuit diagrams each showing electrical connection of diffusion induction electrodes of the plasma process chamber shown in FIG. 11.

Referring to the drawings, the gas shower head 25 placed in the upper housing 21 of the plasma process chamber 20 is used as one of diffusion induction electrodes for delivering diffusion energy into the plasma process chamber 20, and the substrate 27 placed in the lower housing 22 is used as the other of the diffusion induction electrodes. In order to use the gas shower head 25 and the substrate 27 as the diffusion induction electrodes, at the center of the upper plate of the upper housing 21 and the center of the lower plate of the lower housing 22 are each of insulators 61 and 62 for insulating the gas shower head 25 and the substrate 27, respectively.

How to use the gas shower head 25 and the substrate 27 as the diffusion induction electrodes and to connect electrically them to the second A.C. power source 32 is as follows: a node a, which is connected to the substrate 26, is connected electrically to the second A.C. power source 32 via the second impedance matching unit 33, and a node b, which is connected to the gas shower head 25, is connected electrically to the second A.C. power source 32, as shown in FIG. 12a. Alternatively, nodes a and b, which are connected to each other, are connected to electrically to the second A.C. power source 32 via the second impedance matching unit 33, and a node c, which is connected to the lower housing 22 (or the upper housing 21), is connected electrically to the second A.C. power source 32, as shown in FIG. 12b.

When the plasma reactor 50 is operated in the plasma process chamber 20 constructed as mentioned above to generate plasma, A.C. power is applied from the second A.C. power source 32 to the gas shower head 25 and the substrate 27 so that an electric field is generated between the gas shower head 25 and the substrate 27. As a result, ion particles in the plasma state generated at the center of the plasma process chamber 20, in which the plasma reactor 50 is placed, are guided to the gas shower head 25 and the substrate 27 and then diffused.

With the plasma process chamber 20 according to the third embodiment of the present invention, the gas shower head 25 and the substrate 27 are used as the diffusion induction electrodes. Consequently, the plasma ion particles generated at the central area of the plasma process chamber 20 are diffused uniformly in the plasma process chamber so that cleaning efficiency can be highly increased.

Embodiment 4

Figure 13:
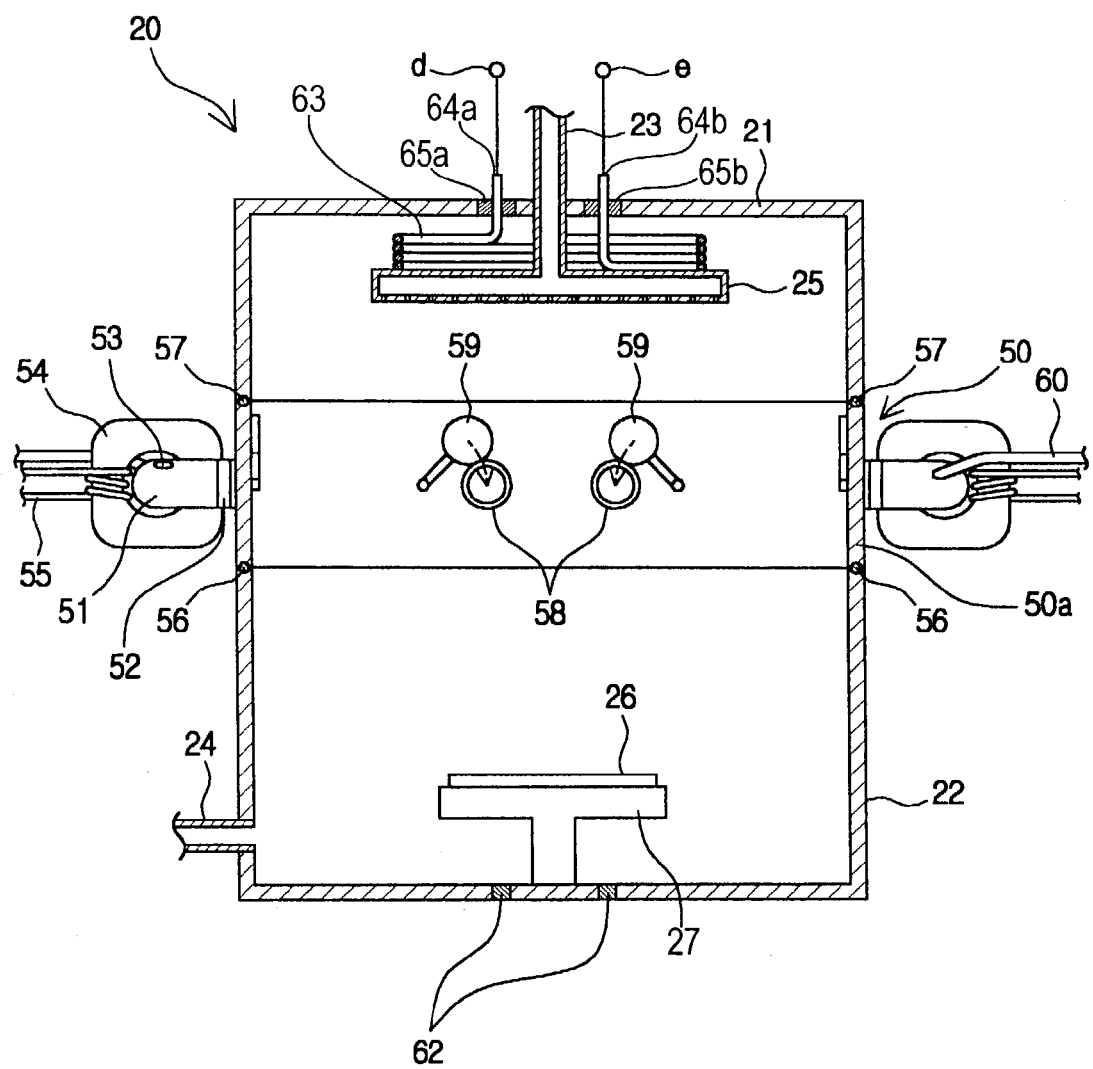
FIG. 13 is a cross sectional view of a plasma process chamber according to a fourth preferred embodiment of the present invention.
Figure 14:
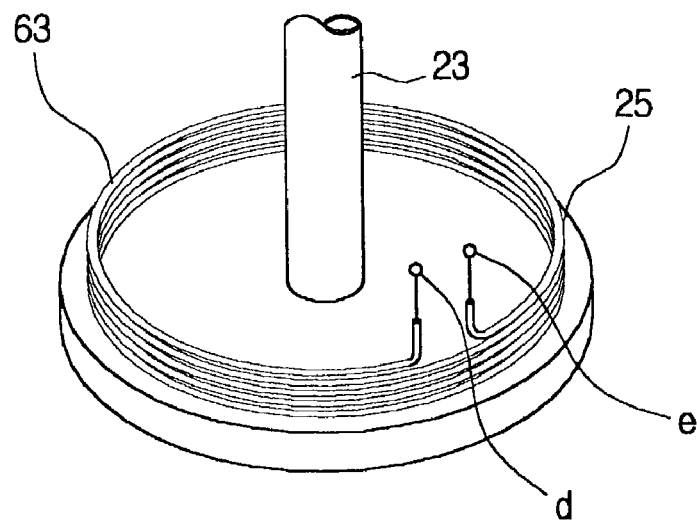
FIG. 14 is a perspective view of a gas shower head and a diffusion induction coil mounted to the gas shower head.
Figure 15:
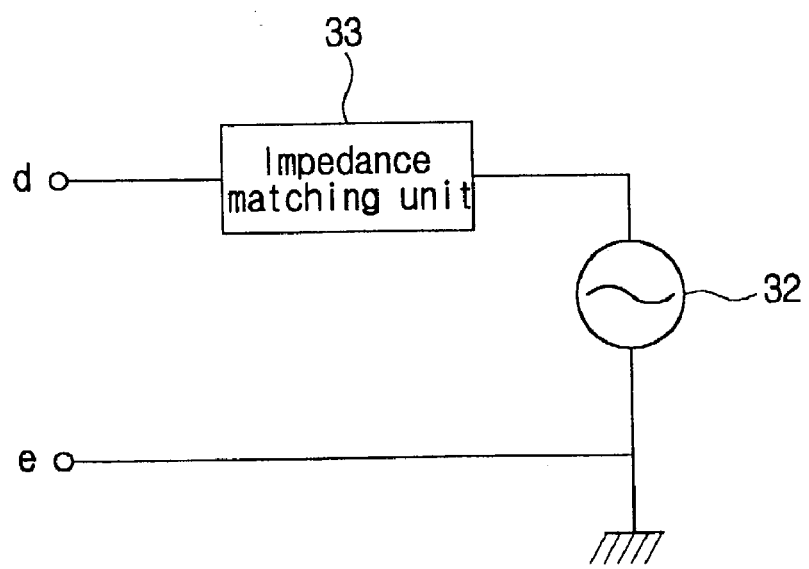
FIG. 15 is a circuit diagram showing electrical connection of the diffusion induction coil shown in FIG. 14.

FIG. 13 is a cross sectional view of a plasma process chamber according to a fourth preferred embodiment of the present invention, FIG. 14 is a perspective view of a gas shower head and a diffusion induction coil mounted to the gas shower head, and FIG. 15 is a circuit diagram showing electrical connection of the diffusion induction coil shown in FIG. 14.

Referring to the drawings, a diffusion induction coil 63 is arranged on the upper part of the gas shower head 25 of the plasma process chamber 20 according to the fourth preferred embodiment of the present invention. Both ends 64a and 64b of the diffusion induction coil 63 are extended outwardly through two insulated holes 65a and 65b, respectively, formed at the upper surface of the upper housing 21, and nodes d and e, which are connected electrically to the ends 64a and 64b, respectively, are connected to the second A.C. power source 32 via the second impedance matching unit 33.

When the plasma reactor 50 is operated in the plasma process chamber 20 constructed as mentioned above to generate plasma, A.C. power is applied from the second A.C. power source 32 to the diffusion induction coil 63 so that a secondary electric field created by inducing a magnetic field is generated in the vicinity of the gas shower head 25. As a result, ion particles in the plasma state generated at the center of the plasma process chamber 20, in which the plasma reactor 50 is placed, are guided to the gas shower head 25 and then diffused.

With the plasma process chamber 20 according to the fourth embodiment of the present invention, the diffusion induction coil 63 is arranged on the upper part of the gas shower head 25 of the plasma process chamber 20. Consequently, the plasma ion particles generated at the central area of the plasma process chamber 20 are diffused toward the gas shower head 25 so that cleaning efficiency can be highly increased. Especially, the plasma process chamber according to this embodiment is very effective in cleaning the gas shower head 25 in case that the gas shower head 25 is contaminated severely during the process.

Embodiment 5

Figure 16:
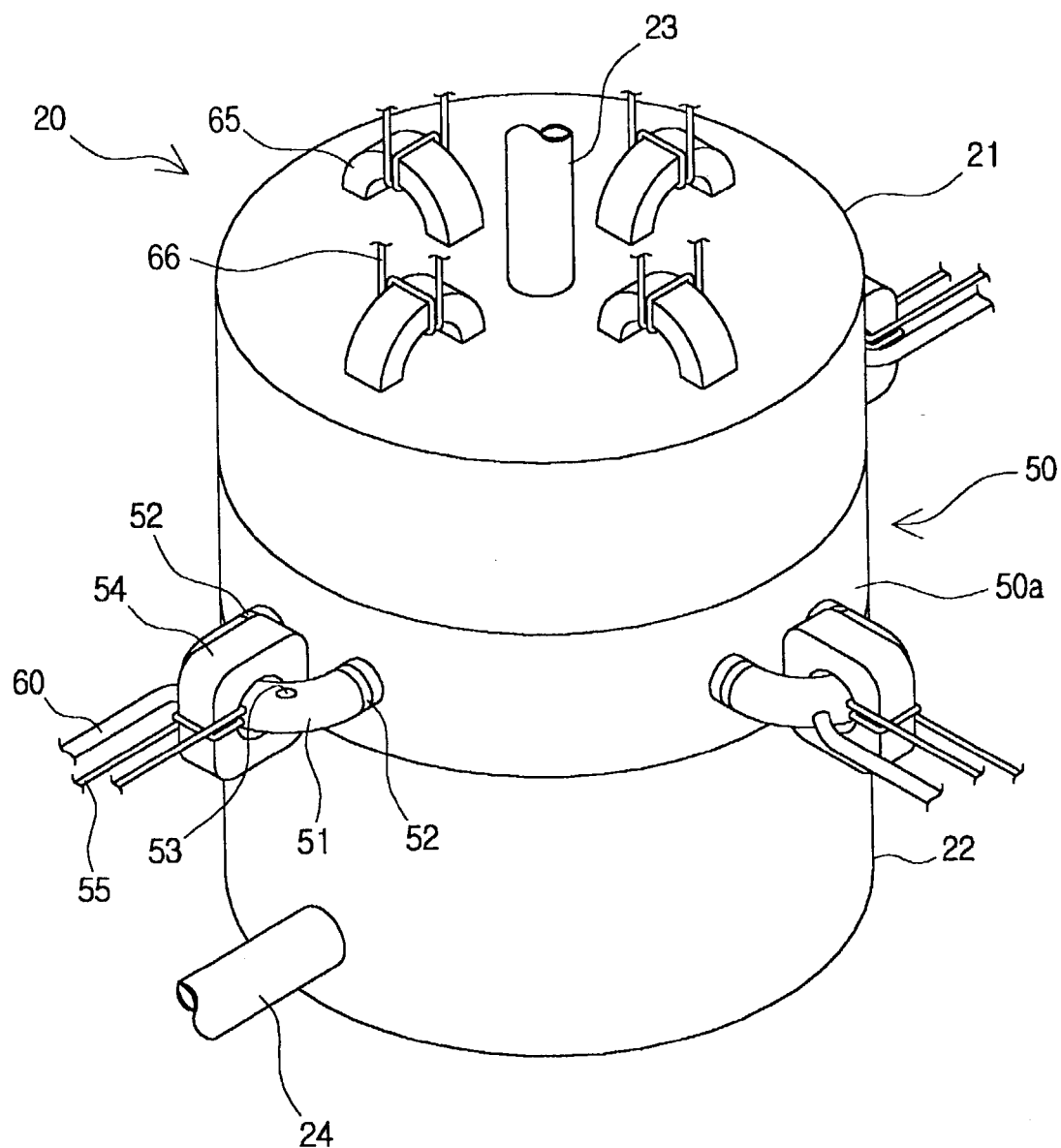
FIG. 16 is a perspective view of a plasma process chamber according to a fifth preferred embodiment of the present invention.

FIG. 16 is a perspective view of a plasma process chamber according to a fifth preferred embodiment of the present invention.

Referring to the drawing, a plurality of magnetic cores 65 of horseshoe shape (or U-shape), on which coils 66 are wound respectively, are mounted to the upper surface of the upper housing 21 of the plasma process chamber 20 according to the fifth preferred embodiment of the present invention. The coils 66, each of which is wound on the corresponding one of the cores 65, are connected electrically either in series or in parallel to the second A.C. power source 32 via the second impedance matching unit 33.

When the plasma reactor 50 is operated in the plasma process chamber 20 constructed as mentioned above to generate plasma, A.C. power is applied from the second A.C. power source 32 to the coils 66 so that a secondary electric field created by inducing a magnetic field is generated in the vicinity of the gas shower head 25 placed above in the upper housing 21. As a result, ion particles in the plasma state generated at the center of the plasma process chamber 20, in which the plasma reactor 50 is placed, are guided to the gas shower head 25 and then diffused.

With the plasma process chamber 20 according to the fifth embodiment of the present invention, the plasma ion particles generated at the central area of the plasma process chamber 20 are diffused toward the gas shower head 25 so that cleaning efficiency can be highly increased. Especially, the plasma process chamber according to this embodiment is very effective in cleaning the gas shower head 25 in case that the gas shower head 25 is contaminated severely during the process, as in the fourth preferred embodiment of the present invention.

Although the construction and operation of the plasma process chamber and system according to the preferred embodiments of the present invention has been described herein and shown in the drawings, such description and drawings are merely for illustrative purposes only, and it is to be understood that various changes or modifications will be apparent to those skilled in the art without departing from the spirit of the invention.

With the plasma process chamber and system according to the present invention as fully described above, the plasma reaction is generated and distributed evenly in the plasma process chamber so that uniformity of the plasma can be guaranteed. Furthermore, the plasma reaction is generated by a plurality of the reactor tubes so that high density of the plasma can be obtained.

What is claimed is:

1. A plasma process chamber, comprising:

an upper housing providing a first chamber including a gas inlet connected to a gas source, and a gas shower head placed in said upper housing within said first chamber;

a lower housing providing a second chamber including a gas outlet connected to a vacuum pump, and a substrate provided on the inner bottom of said lower housing, a wafer being placed on said substrate; and a plasma reactor provided between said upper housing and said lower housing, said plasma reactor including a main body between said upper housing and said lower housing, and at least one reactor tube of horseshoe shape, said reactor tube of horseshoe shape being attached entirely on the outer circumference of said main body between said upper housing and said lower housing, a closed magnetic core attached to said reactor tube, and a coil wound on said magnetic core, said coil being connected electrically to an alternating current power source via an impedance matching unit, said reactor tube being made of a metal, and an insulator being provided between said main body and said reactor tube and said insulator being directly adjacent to said main body and reactor tube, and said first chamber, second chamber and main body being separate from each other.

* * * * *